(12) United States Patent
Mohamad et al.

(10) Patent No.: US 12,457,789 B2
(45) Date of Patent: Oct. 28, 2025

(54) TRANSISTOR

(71) Applicant: Commissariat à l'Énergie Atomique et aux Énergies Alternatives, Paris (FR)

(72) Inventors: Blend Mohamad, Grenoble (FR); René Escoffier, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 563 days.

(21) Appl. No.: 17/668,198

(22) Filed: Feb. 9, 2022

(65) Prior Publication Data
US 2022/0271134 A1    Aug. 25, 2022

(30) Foreign Application Priority Data
Feb. 16, 2021    (FR) ...................... 2101478

(51) Int. Cl.
| | | |
|---|---|---|
| *H10D 64/27* | (2025.01) | |
| *H10D 30/01* | (2025.01) | |
| *H10D 30/47* | (2025.01) | |
| *H10D 64/01* | (2025.01) | |
| *H10D 64/23* | (2025.01) | |

(52) U.S. Cl.
CPC ......... *H10D 64/513* (2025.01); *H10D 30/015* (2025.01); *H10D 30/475* (2025.01); *H10D 64/01* (2025.01); *H10D 64/516* (2025.01); *H10D 64/518* (2025.01); *H10D 64/258* (2025.01)

(58) Field of Classification Search
CPC .................... H01L 29/42368; H01L 29/66462
See application file for complete search history.

(56) References Cited

U.S. PATENT DOCUMENTS

2014/0239311 A1    8/2014  Kawai et al.
2021/0384337 A1*  12/2021  Kato ................... H01L 29/2003

FOREIGN PATENT DOCUMENTS

| JP | 2014-192167 A | 10/2014 |
|---|---|---|
| JP | 6507983 B2 | 5/2019 |

OTHER PUBLICATIONS

Preliminary Search Report for French Application No. 2101478, dated Oct. 12, 2021.

* cited by examiner

*Primary Examiner* — Yu-Hsi D Sun
(74) *Attorney, Agent, or Firm* — Wolf, Greenfield & Sacks, P.C.

(57) ABSTRACT

A transistor comprising a gallium nitride layer having a first gate electrode partially penetrating into it, having: a first side coated with a first thickness of a first insulating material and of a second insulating material; and with a second thickness of a conductive material; and a bottom coated with a third thickness, smaller than the first thickness, of the first insulating material.

16 Claims, 4 Drawing Sheets

DETAIL-C

TRANSISTOR

CROSS REFERENCE TO RELATED APPLICATION(S)

This application is a translation of and claims the priority benefit of French patent application number 21/01478, filed on Feb. 16, 2021, entitled "Transistor" which is hereby incorporated by reference to the maximum extent allowable by law.

TECHNICAL BACKGROUND

The present disclosure generally concerns electronic devices. The present disclosure more particularly concerns normally-off high electron mobility transistors (HEMT), or HEMT transistors, based on gallium nitride (GaN) and methods of manufacturing such transistors.

PRIOR ART

Normally-off HEMT gallium nitride transistors are currently used in electric energy conversion applications, for powers typically in the range from a few milliwatts to several tens of watts. There exist several types of normally-off HEMT transistors, particularly HEMT transistors comprising an insulated gate of metal-insulator-semiconductor (MIS) type, or MIS-HEMT transistors. Such transistors generally have a strong on-state resistance, which adversely affects their performance. Further, these transistors are affected by problems linked to parasitic gate capacitances.

SUMMARY

There is a need to improve existing normally-off insulated gate high electron mobility gallium nitride transistors.

An embodiment overcomes all or part of the disadvantages of existing normally-off high electron mobility gallium nitride transistors.

An embodiment provides a transistor comprising a gallium nitride layer having a first gate electrode partially penetrating into it, having:
  a first side coated:
    with a first thickness of a first insulating material and of a second insulating material; and
    with a second thickness of a conductive material; and
  a bottom coated with a third thickness, smaller than the first thickness, of the first insulating material.

According to an embodiment, the transistor further comprises second and third electrodes, located on either side of the first electrode and partially penetrating into the gallium nitride layer, the second electrode being closer to the first electrode than the third electrode and the first side being located on the side of the second electrode.

According to an embodiment, the conductive material coating the first side extends all the way to the second electrode.

According to an embodiment, the bottom of the first electrode is separated from the gallium nitride layer only by the third thickness of the first insulating material.

According to an embodiment, a second side of the first electrode, opposite to the first side, is coated with the first insulating material, with a thickness equal to the third thickness.

According to an embodiment, a second side of the first electrode, opposite to the first side, is coated with the first insulating material and with the second insulating material, with a thickness equal to the first thickness.

According to an embodiment, the second side is further coated with the conductive material, with a thickness equal to the second thickness.

According to an embodiment, the conductive material coating the second side is insulated from the conductive material coating the first side.

According to an embodiment, the second insulating material is identical to the first insulating material.

According to an embodiment, the second insulating material is different from the first insulating material.

An embodiment provides a method of manufacturing a transistor such as described, comprising the steps of:
  a) forming a trench inside of a gallium nitride layer;
  b) coating a first side of the trench with a conductive layer and then with a first insulating layer;
  c) coating a bottom of the trench with a second insulating layer, thinner than the first insulating layer; and
  d) forming a first gate electrode of the transistor inside of the trench.

According to an embodiment, at step c), the first insulating layer is coated with the second insulating layer.

According to an embodiment, at step c), a second side of the trench, opposite to the first side, is coated with the second insulating layer.

According to an embodiment, at step b), the second side of the trench is coated with the conductive layer.

According to an embodiment, at step b), the second side of the trench is then coated with the first insulating layer.

According to an embodiment, the method further comprises, between steps b) and c), the step of removing portions of the first insulating layer and of the conductive layer located at the bottom of the trench.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DESCRIPTION OF THE EMBODIMENTS

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the applications and devices likely to take advantage of the described transistors are not detailed, the described embodiments and implementation modes being compatible with usual applications and devices comprising high electron mobility gallium nitride transistors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "about", "approximately", "substantially", and "in the order of" signify within 10% or 10°, preferably within 5% or 5°.

In the following description, unless specified otherwise, the terms insulating and conductive respectively signify electrically insulating and electrically conductive.

Figure 1:
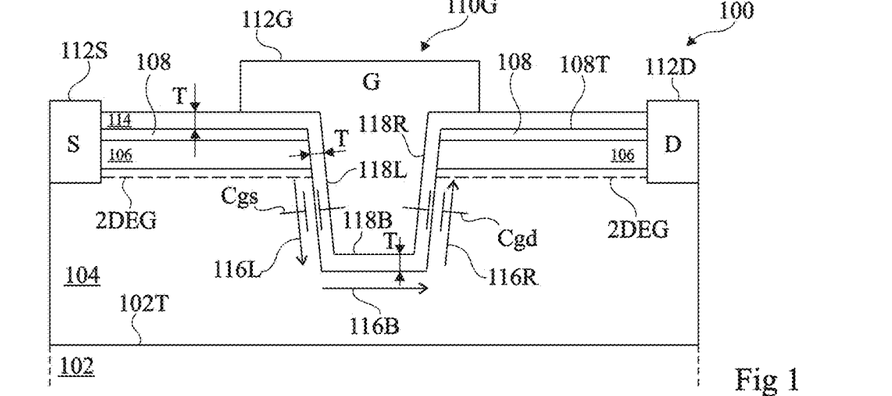
FIG. 1 is a partial simplified cross-section view of an example of a transistor.

FIG. 1 is a partial simplified cross-section view of an example of a high electron mobility transistor (HEMT) 100, or HEMT transistor. HEMT transistor 100 is normally off in this example.

In the shown example, HEMT transistor 100 is formed on a substrate 102. Substrate 102 is for example a wafer, or a wafer piece, a single portion of which is shown in FIG. 1. As an example, substrate 102 is made of a semiconductor material, for example, of silicon, or of glass, of sapphire, etc.

In the orientation of FIG. 1, a layer 104 coats an upper surface 102T of substrate 102. As an example, layer 104 is made of gallium nitride (GaN), for example, of intrinsic, that is, non intentionally doped, gallium nitride.

In the shown example, another layer 106 coats an upper surface of layer 104. As an example, layer 106 is made of aluminum-gallium nitride (AlGaN).

In the shown example, still another layer 108 coats an upper surface of layer 106. As an example, layer 108 is made of silicon nitride (SiN).

Transistor 100 comprises a gate region 110G. The gate region 110G of transistor 100 is said to be recessed in gallium nitride layer 104. More precisely, in the shown example, gate region 110G extends vertically, from an upper surface 108T of layer 108, towards the upper surface 102T of substrate 102. Each layer 106, 108 thus comprises two separate portions, located on either side of gate region 110G.

In the shown example, the gate region 110G of transistor 100 comprises a gate electrode 112G (G). Electrode 112G has a T-shaped cross-section, having a vertical portion crossing layers 108 and 106 and partially penetrating into the thickness of layer 104. Further, a horizontal portion of the T formed by gate electrode 112G extends above layer 108.

In the shown example, the sides of the vertical portion of the T formed by gate electrode 112G are inclined so that they come closer to each other at the bottom of electrode 112G. This enables to ease the passage of electrons from one side to the other of electrode 112G.

Gate electrode 112G is made of a conductive material. As an example, electrode 112G is made of a metal or of a metal alloy, for example, an alloy based on titanium nitride (TiN) or of tungsten (W).

In the shown example, still another layer 114 insulates electrode 112G from layers 104, 106, and 108. Layer 114 is made of an insulating material. As an example, layer 114 is made of alumina ($Al_2O_3$).

Insulating layer 114 coats the lateral surfaces and the lower surface of the vertical portion of the T formed by electrode 112G. This lower surface is also called bottom of electrode 112G. Further, insulating layer 114 laterally extends on either side of the vertical portion and under the horizontal portion of the T formed by electrode 112G. Layer 114 extends on top of and in contact with the upper portion 108T of layer 108.

In the shown example, the horizontal portion of the T formed by electrode 112G extends on top of and in contact with portions of layer 114. These portions of layer 114 are thus vertically interposed between layer 108 and the horizontal portion of the T formed by electrode 112G.

The portions of layer 114 located vertically in line with gate electrode 112G are considered as forming part of the gate region 110G of transistor 100.

In the shown example, layer 114 has a substantially constant thickness T. As an example, the thickness T of layer 114 is equal to approximately 30 nm, within plus or minus 20%. This enables to properly insulate gate electrode 112C with respect to gallium nitride layer 104 while keeping a relatively low threshold voltage Vth, for example, in the order of 1 V.

Transistor 100 further comprises two other electrodes 112S and 112D. Electrodes 112S and 112D are located on either side of the gate electrode 112G of transistor 100. Electrode 112S is for example closer to gate electrode 112G than electrode 112D. The electrodes 112S, 112G, and 112D of transistor 100 extend perpendicularly to the cross-section plane of FIG. 1, along a direction commonly called width (W) of transistor 100. The cross-section plane of FIG. 1 is thus oriented parallel to another direction commonly called length (L) of transistor 100 and perpendicularly to the upper surface 108T of layer 108.

As an example:

electrode 112S is separated from electrode 112G by a distance in the range from 1 to 2 µm, for example, equal to approximately 1 µm; and electrode 112D is separated from electrode 112G by a distance in the range from 10 to 20 µm, for example, equal to approximately 10 µm, to ensure a voltage resistance for example ranging up to 1,000 V (the maximum electric field in GaN theoretically is 2 MV/cm, but it is in practice for example limited to 1 MV/cm by the quality of GaN layer 104).

In the shown example, electrodes 112S and 112D each vertically extend, from the upper surface of insulating layer 114, towards the upper surface 102T of substrate 102. More precisely, in the shown example, electrodes 112S and 112D each cross layers 114, 108, and 106 and partially penetrate into the thickness of layer 104.

Electrodes 112S and 112D are each made of a conductive material, for example, a metal or a metal alloy. Electrodes 112S and 112D are for example made of the same material as electrode 112G.

As an example, when transistor 100 is operating, electrode 112S is a source electrode (S) and electrode 112D is a drain electrode (D). Electrode 112D being more distant from electrode 112G than electrode 112S, this enables to apply a high potential, for example in the order of 650 V, on electrode 112D with no risk of breakdown of transistor 100, electrodes 112S and 112G being generally submitted to potentials in the order of a few volts.

In HEMT transistor 100, a two-dimensional electron gas (2DEG), symbolized in FIG. 1 by a dotted line, forms inside of layer 104 close to an interface between layers 104 and 106. The electrodes 112S and 112D of HEMT transistor 100 are each in contact with the two-dimensional electron gas 2DEG.

In the shown example where HEMT transistor 100 is normally off, the two-dimensional electron gas 2DEG is interrupted by gate region 110G. More precisely, in this example, the two-dimensional electron gas 2DEG is discontinuous and comprises two portions located on either side of the gate region 110G of transistor 100 (on the left-hand side and on the right-hand side of region 110G, in the orientation of FIG. 1).

When a substantially zero voltage Vgs is applied between gate electrode 112G and source electrode 112S, the gate region 110G recessed in gallium nitride layer 104 prevents the electrons from flowing between source electrode 112S and drain electrode 112D. Transistor 100 then is in an off state.

However, when the voltage Vgs applied between gate electrode 112G and source electrode 112S exceeds the threshold voltage Vth of transistor 100, electrons may flow between source electrode 112S and drain electrode 112D. Transistor 100 then is in a conductive state.

In the conductive state, electrons flow from one portion to the other of the two-dimensional electron gas 2DEG, bypassing gate region 110G. More precisely, when transistor 100 is conductive and submitted to a bias voltage applied between its drain D and its source S, the electrons then take, to flow from one side to the other of gate G, a conduction path located inside of layer 104 along an interface between layer 104 and insulating layer 114.

The conduction path taken by the electrons to bypass gate region 110G is symbolized, in FIG. 1, by arrows 116L, 116B, and 116R. More particularly, in the orientation of FIG. 1:

arrow 116L symbolizes a path followed by the electrons to flow down along a first side 118L of gate electrode 112G located on the side of source electrode 112S;

arrow 116B symbolizes a path followed by the electrons to displace horizontally under the bottom 118B of gate electrode 112G; and arrow 116R symbolizes a path followed by the electrons to flow up along a second side 118LR of gate electrode 112G opposite to side 118L, located on the side of drain electrode 112D.

Although this has not been shown in FIG. 1, transistor 100 may further comprise other elements such as insulating layers coating layer 114 and/or a portion of gate electrode 112G, field plates, contacting elements, etc.

A disadvantage of HEMT transistors similar to transistor 100 lies in the fact that they have, in the on state, a high on-state drain-source resistance Ron which strongly degrades their electric performance. This is particularly due to resistances associated with the conduction path 116L, 116B, and 116R followed by the electrons to bypass gate region 110G.

To decrease the on-state resistance Ron of transistor 100, it may be devised to provide a structure where insulating layer 114 would be omitted and where gate electrode 112G would not penetrate into gallium nitride layer 104. This would for example amount to ascertaining that electrode 112G stops in the thickness of layer 106, before the interface between layer 106 and layer 104. A Schottky-type gate, which would enable to locally interrupt or attenuate the two-dimensional electron gas 2DEG vertically in line with gate electrode 112G, would thus be formed to obtain a normally-off transistor. However, this would not enable to reach a threshold voltage Vth greater than approximately 1 V, which is a problem for most applications using HEMT transistors.

It could further be devised to form a structure where gate region 110G would not be recessed in layers 108, 106, and 104. This would for example amount to forming gate electrode 112G on top of and in contact with layer 108. As an example, an implantation of fluorine ions (F$^+$) may in particular be provided in layer 106, vertically in line with gate electrode 112G, which would result in attenuating or in interrupting the two-dimensional electrons gas 2DEG under the gate of transistor 100. This would however tend to complicate a control of threshold Vth.

It could as an alternative be provided to omit layer 114, to form gate electrode 112G above layer 108, and to interpose a P-type doped gallium nitride layer (p-GaN) between the gate electrode and layer 108. However, this would not enable t reach a threshold voltage Vth sufficiently high for the targeted applications.

It could further be devised to decrease the width of the lower surface 118B of the vertical portion of the T formed by gate region 110G, to decrease the length of horizontal conduction path 116B. However, this would not enable to significantly decrease the on-state resistance Ron of transistor 100.

Another disadvantage of HEMT transistors similar to transistor 100 lies in the fact that they have, on either side of gate region 110G, parasitic capacitances Cgs and Cgd. Capacitance Cgs more precisely corresponds to a parasitic capacitance between the portion of the two-dimensional electron gas 2DEG located on the side of source electrode 112S (the left-hand portion of the two-dimensional electron gas 2DEG, in the orientation of FIG. 1) and side 118L of gate electrode 112G. Capacitance Cgd more precisely corresponds to another parasitic capacitance between the portion of the two-dimensional electron gas 2DEG located on the side of drain electrode 112D (the right-hand portion of the two-dimensional electron gas 2DEG, in the orientation of FIG. 1) and side 118R of gate electrode 112G. Capacitive elements Cgs and Cgd adversely affect the operation of transistor 100 particularly at high switching frequencies, for example in the range from one hundred kilohertz to several megahertz.

Figure 2:
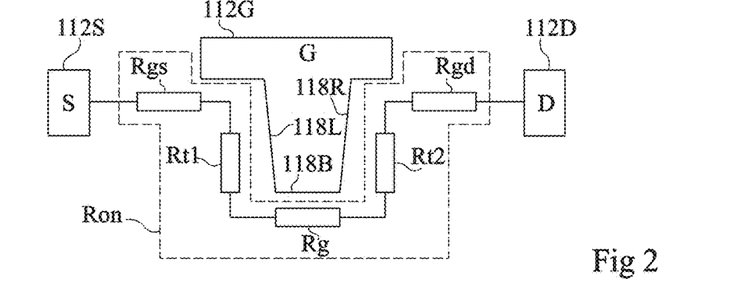
FIG. 2 is an electric diagram equivalent to the transistor of FIG. 1.

FIG. 2 is an electric diagram equivalent to the transistor 100 of FIG. 1.

As illustrated in FIG. 2, the on-state resistance Ron of transistor 100, between its source terminal 112S and its drain terminal 112D, may be broken down into:
- a resistance Rg, corresponding to a conduction path following the portion of the two-dimensional electron gas 2DEG located between source electrode 112S and gate electrode 112G;
- still another resistance Rg, corresponding to the conduction path 116B followed by electrons to horizontally displace under the bottom 118B of electrode 112G;
- still another resistance Rt2, corresponding to the conduction path 116R followed by electrons to flow up along side 118R of electrode 112G; and
- still another resistance Rgd, corresponding to a conduction path running through the portion of the two-dimensional electron gas 2DEG located between gate electrode 112G and drain electrode 112D.

Resistances Rgs, Rt1, Rg, Rt2, and Rgd, the series association of which is equivalent to resistance Ron (neglecting the source and drain ohmic contact resistors), adversely affect the operation of transistor 100 as previously discussed in relation with FIG. 1. In particular, resistance Rt1 generally has a significant value, which modifies the on-state resistance of transistor 100.

Figure 3:
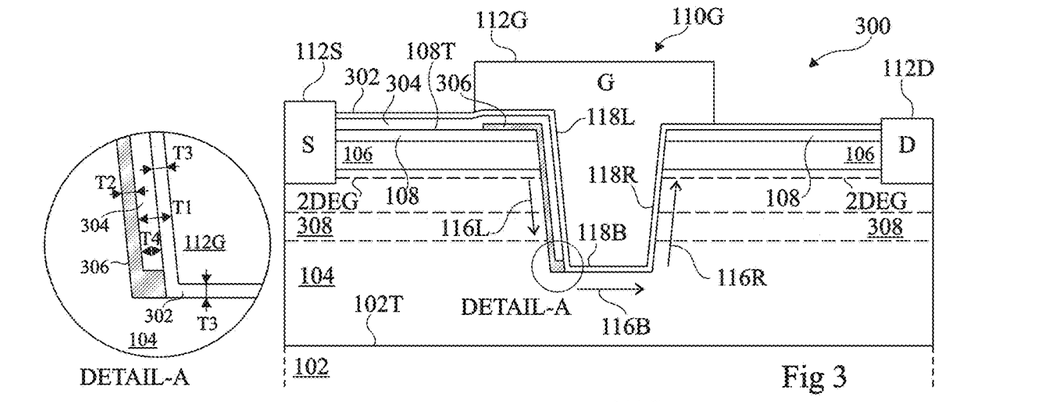
FIG. 3 is a partial simplified cross-section view of a transistor according to a first embodiment.

FIG. 3 is a partial simplified cross-section view of a normally-off HEMT transistor 300 according to a first embodiment.

The transistor 300 of FIG. 3 comprises elements common with the transistor 100 of FIG. 1. These common elements will not be described again. In particular, transistor 300 comprises, like transistor 100, substrate 102 having its upper surface 102T coated with gallium nitride layer 104, aluminum-gallium nitride layer 106, and silicon nitride layer 108. Transistor 300 further comprises gate region 110G and electrodes 112S, 112G, and 112D previously described in relation with the transistor 100 of FIG. 1.

According to the embodiment illustrated in FIG. 3, side 118L of the gate electrode 112G of transistor 300 is coated with a first thickness T1 (DETAIL-A) of a first insulating material 302 and of a second insulating material 304. Side 118L is further coated with a second thickness T2 of a conductive material 306. Further, bottom 118B of electrode 112G of transistor 300 is coated with a third thickness T3 of first insulating material 302.

More precisely, in the shown example:
- the thickness T3 of first insulating material 302 extends in contact with electrode 112G along side 118L and side 118B;
- a fourth thickness T4 made of a second insulating material 304 extends in contact with first insulating material 302 along side 118L of electrode 112G, but does not extend along bottom 118B; and
- the thickness T2 of conductive material 306 extends in contact with second insulating material 304 along side 118L of electrode 112G, but does not extend along bottom 118B.

Thickness T1 corresponds, in this example, to the addition of the thickness T3 of first insulating material 302 and of the thickness T4 of second insulating material 304 (T1=T3+T4). The thickness T1 of insulating materials 302 and 304 coating side 118L of the gate electrode 112G of transistor 300 thus is greater than the thickness T3 of the insulating material 304 coating the bottom 118B of electrode 112G. The thickness T3 of first insulating material 302 is for example substantially equal to the thickness T of the layer 114 of the transistor 100 of FIG. 1. As an example, thickness T3 is equal to approximately 30 nm, to within more or less 20%, and thickness T4 is in the range from 30 to 100 nm, for example, equal to 50 nm. Thickness T1 is for example in the range from 60 to 130 nm.

In the shown example, side 118R of the gate electrode 112G of transistor 300 is coated with first insulating material 302, with a thickness corresponding to third thickness T3. More precisely, first insulating material 302, having a thickness T3, extends in contact with electrode 112G along side 118R. In this example, first insulating material 302 forms a continuous layer coating sides 118L, 118R and the bottom 118B of electrode 112G.

In the shown example, conductive material 306 extends on top of and in contact with the upper surface 108T of layer 108. In this example, conductive material 306 continues extends source electrode 112S vertically in line with gate electrode 112G without contacting source electrode 112S.

As an example, the thickness T2 of conductive material 306 is in the range from 5 to 10 nm.

Conductive material 306 is for example a metal, a metal alloy, or an N-type doped semiconductor. As an example, conductive material 306 is aluminum (Al), gold (Au), copper (Cu), or titanium nitride (TiN).

In the shown example, transistor 300 further comprise a back barrier layer 308. Layer 308 enables to compensate negative charges trapped in the vicinity of the gate, which tend to offset the threshold voltage Vth of transistor 300 towards lower values. As an example, barrier layer 308 is formed by a P-type doping of layer 104. As an example, the doping is performed by implantation of magnesium ions ($Mg^{2+}$) at a rate in the range from $10^{17}$ to $10^{18}$ at./cm$^3$.

Second insulating material 304 is for example different from first insulating material 302. As an example, first and second insulating materials 302, 304 are each selected from among alumina ($Al_2O_3$) and silica ($SiO_2$).

As a variant, second insulating material 304 is identical to first insulating material 302. In this case, side 118L of the gate electrode 112G of transistor 300 is coated with first insulating material 302, for example, alumina, with a thickness equal to first thickness T1.

An advantage of the embodiment of transistor 300 discussed in relation with FIG. 3 lies in the fact that conductive material 306 borders side 118L of gate electrode 112G. This enables electrons to more easily flow around gate region 110G. More precisely, the thickness T2 of conductive material 306 enables electrons to more easily flow down along side 118L. In transistor 300, the presence of conductive material 306 along side 118L of electrode 112G more precisely enables, as compared with the transistor 100 of FIG. 1, to avoid a drop in mobility due to interface states and to trap levels close to the interface between layer 104 and gate region 110G.

The trapping of electrons for example results in a hysteresis problem, for example observable on curves of variation of a drain current Id according to the voltage Vgs applied between gate and source electrodes 112G and 112S (curves Id(Vgs)). The trapping further causes a strong attenuation (collapse) of drain current Id after the biasing of transistor 100, for example observable on curves of drain current Id versus a voltage Vds applied between drain and source electrodes 112D and 112S (curves Id(Vds)). In the case of transistor 300, the electron trapping phenomenon is strongly decreased along conduction path 116L since electrons preferably flow through conductive material 306 rather than through layer 104.

Another advantage of this embodiment lies in the fact that transistor 300 comprises an overthickness of insulating material on side 118L of gate electrode 112G, providing a higher insulation between electrode 112G and layer 104 as compared with the case of the transistor 100 of FIG. 1. This overthickness is due to the presence of second insulating material 304 along side 118L of electrode 112G, bottom 118B comprising no second insulating material 304. Further, the bottom 118B of electrode 112G is separated from layer 104 only by the thickness T3 of first insulating material 302. This enables to decrease the stray capacitance Cgs of transistor 300 by from approximately 15 to 30% with respect to a transistor 300 having its side 118L comprising no insulating material 304 and by from approximately 40 to 45% with respect to transistor 100. Threshold voltage Vth is thus relatively low, for example, in the order of 1 V, and mainly controlled by the bottom 118B of gate electrode 112G, conversely to a case where the bottom 118B of electrode 112G of transistor 300 would be coated with a greater thickness of insulating material, for example, equal to thickness T1.

Figure 4:
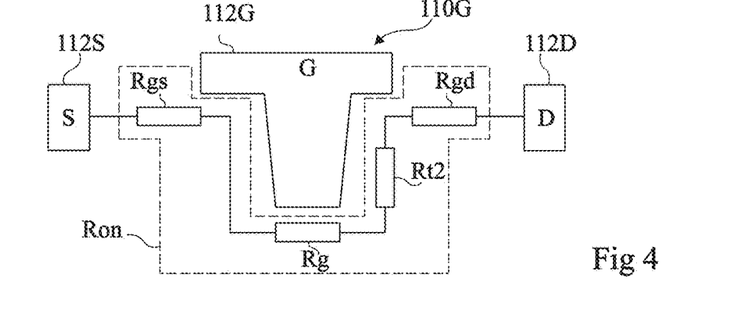
FIG. 4 is an electric diagram equivalent to the transistor of FIG. 3.

FIG. 4 is an electric diagram equivalent to the transistor 300 of FIG. 3.

As compared with the transistor 100 of FIG. 1, the resistance Rt1 of transistor 300 is substantially zero due to the presence of conductive material 306 along side 118L of gate electrode 112G.

As illustrated in FIG. 4, the on-state resistance Ron of transistor 300, between its source terminal 112S and its drain terminal 112D, may then be broken down into:
  the resistance Rgs of the conduction path in the portion of the two-dimensional electron gas 2DEG located between source electrode 112S and gate electrode 112G;
  the resistance Rg of the conduction path 116B followed by electrons to displace along the bottom 118B of electrode 112G;
  the resistance Rt2 of the conduction path 116R followed by electrons to flow up along side 118R of electrode 112G; and
  the resistance Rgd of the conduction path in the portion of the two-dimensional electron gas 2DEG located between gate electrode 112G and drain electrode 112D.

The on-state resistance Ron of transistor 300 is thus lower than that of transistor 100. In the transistor 100 of FIG. 1, the electrons have a low mobility along conduction path 116L. As an example, the mobility of electrons in transistor 100, that is, in the absence of conductive material 306, is in the order of 200 cm$^2$/(V·s) along conduction path 116L and approximately 2,000 cm$^2$/(V·s) in the two-dimensional electron gas 2DEG. The fact of providing conductive material 306 along side 118L of the gate electrode 112G of transistor 300 enables to obtain, along conduction path 116L, an electron mobility much greater than that of transistor 100, for example substantially equal to the mobility in the two-dimensional electron gas 2DEG.

Figure 5:
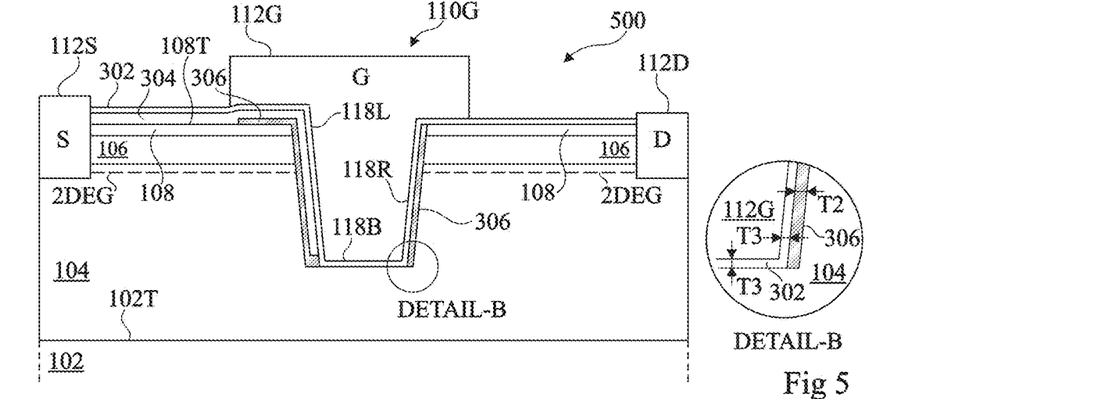
FIG. 5 is a partial simplified cross-section view of a transistor according to a second embodiment.

FIG. 5 is a partial simplified cross-section view of a transistor 500 according to a second embodiment. The transistor 500 of FIG. 5 comprises elements common with the transistor 300 of FIG. 3. These common elements will not be described again hereafter.

Transistor 500 differs from transistor 300 mainly in that side 118R of the gate electrode 112G of transistor 500 is further coated with conductive material 306, over a thickness equal to second thickness T2 (DETAIL-B).

More precisely, in the shown example:
  the thickness T3 of first insulating material 302 extends in contact with electrode 112G along side 118R; and
  the thickness T2 of conductive material 306 extends in contact with first insulating material 302 along side 118R of electrode 112G.

In this example, conductive material 306 forms two separate layer portions, located on either side of the bottom 118B of electrode 112G. More precisely, the conductive material 306 located on side 118L is insulated from the conductive material 306 located on side 118R.

In the shown example, transistor 500 comprises no back barrier layer 308.

An advantage of transistor 500 lies in the fact that conductive material 306 borders side 118R of gate electrode 112G. This enables electrons to more easily flow around gate region 110G. More precisely, conductive material 306 enables electrons to more easily flow up along side 118R. In transistor 500, the presence of conductive material 306 along side 118R of electrode 112G enables, as compared with the transistor 300 of FIG. 3, to further avoid the mobility drop due to interface states and to the trap levels close to the interface between layer 104 and gate region 110G.

Figure 6:
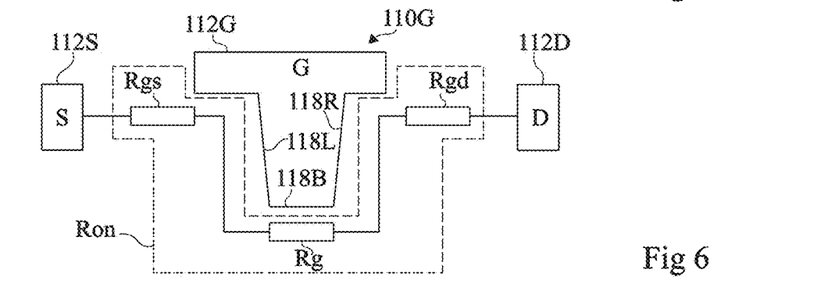
FIG. 6 is an electric diagram equivalent to the transistor of FIG. 5.

FIG. 6 is an electric diagram equivalent to the transistor 500 of FIG. 5.

As compared with the transistor 300 of FIG. 3, the resistance Rt2 of transistor 500 is substantially zero due to the presence of conductive material 306 along side 118R of gate electrode 112G.

As illustrated in FIG. 6, the on-state resistance Ron of transistor 500, between its source terminal 112S and its drain terminal 112D, may then be broken down into:
  the resistance Rgs of the conduction path in the portion of the two-dimensional electron gas 2DEG located between source electrode 112S and gate electrode 112G;
  the resistance Rg of the conduction path 116B followed by electrons to horizontally displace under the bottom 118B of electrode 112G; and
  the resistance Rgd of the conduction path in the portion of the two-dimensional electron gas 2DEG located between gate electrode 112G and drain electrode 112D.

The on-state resistance Ron of transistor 500 is thus even lower than that of transistor 300. The fact of providing conductive material 306 along side 118R of the gate electrode 112G of transistor 500 enables to obtain, along conduction path 116R, an electron mobility for example substantially equal to the mobility in the two-dimensional electron gas 2DEG.

Figure 7:
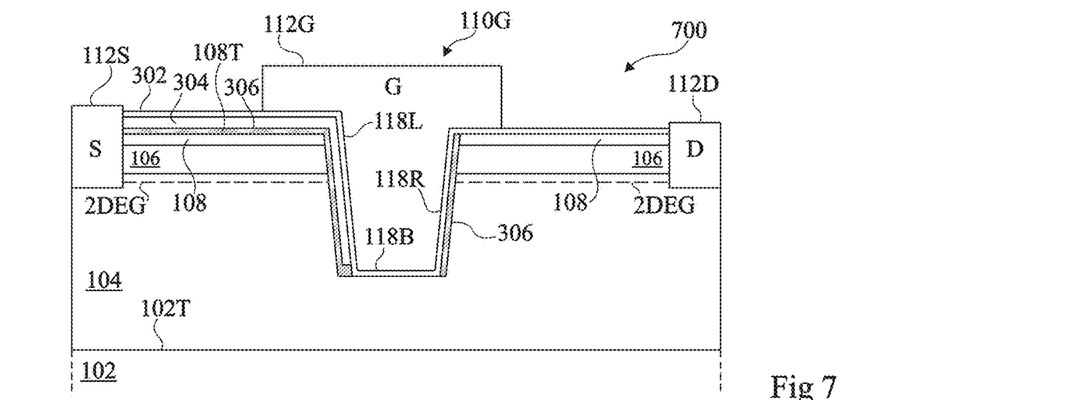
FIG. 7 is a partial simplified cross-section view of a transistor according to a third embodiment.

FIG. 7 is a partial simplified cross-section view of a transistor 700 according to a third embodiment. The transistor 700 of FIG. 7 comprises elements common with the transistor 500 of FIG. 5. These common elements will not be described again.

Transistor 700 differs from transistor 500 mainly in that the conductive material 306 located on side 118L of electrode 112G of transistor 700 is connected to source electrode 112S. More precisely, the conductive material layer portion 306 located on side 118L extends, on top of and in contact with the upper surface 108T of layer 108, all the way to electrode 112S. The conductive material layer portion 306 located on side 118L thus has, in the vicinity of the bottom 118B of electrode 112G, a potential substantially equal to that of source electrode 112S, for example, the ground (0 V).

An advantage of the embodiment of transistor 700 discussed hereabove in relation with FIG. 7 lies in the fact that conductive material 306 extends from source electrode 112S to the vicinity of the bottom 118B of gate electrode 112G. This enables electrons to more easily flow between source electrode 112S and the bottom 118B of electrode 112G. Due to the fact that conductive material 306 extends all the way to electrode 112S, a conduction path more favorable than that running through the two-dimensional electron gas 2DEG located in gallium nitride layer 104 is particularly obtained.

Figure 8:
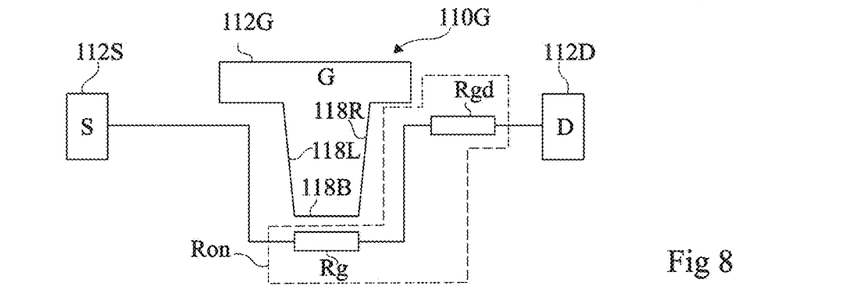
FIG. 8 is an electric diagram equivalent to the transistor of FIG. 7.

FIG. 8 is an electric diagram equivalent to the transistor 700 of FIG. 7.

As compared with the transistor 500 of FIG. 5, the resistance Rgs of transistor 700 is substantially zero due to the connection between the conductive material located along side 118L of gate electrode 112G and source electrode 112S. In the case of transistor 700, the extension of conductive material 306 all the way to electrode 112S enables to limit or to avoid problems of ohmic contact between the two-dimensional electron gas 2DEG and the conductive material 306 located on side 118L of gate electrode 112G. This further allows a better electrostatic control between gate and source, and thus a greater efficiency of control Vgs of transistor 700.

As illustrated in FIG. 8, the on-state resistance Ron of transistor 700, between its source terminal 112S and its drain terminal 112D, may then be broken down into:

the resistance Rg of the conduction path 116B (FIG. 3) followed by electrons to horizontally displace under the bottom 118B of gate electrode 112G; and the resistance Rgd of the conduction path running through the portion of the two-dimensional electron gas 2DEG located between gate electrode 112G and drain electrode 112D.

The on-state resistance Ron of transistor 700 is thus even lower than that of transistor 500.

Figure 9:
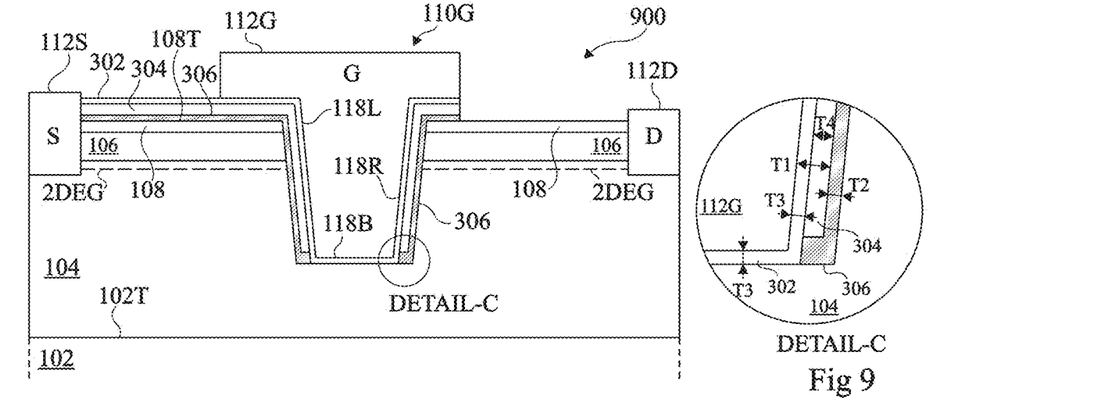
FIG. 9 is a partial simplified cross-section view of a transistor according to a fourth embodiment.

FIG. 9 is a partial simplified cross-section view of a transistor 900 according to a fourth embodiment. The transistor 900 of FIG. 9 comprises elements common with the transistor 700 of FIG. 7. These common elements will not be described again hereafter.

Transistor 900 differs from transistor 700 mainly in that side 118R of the gate electrode 112G of transistor 900 is coated with first insulating material 302, with a thickness corresponding to third thickness T3, and with second insulating material 304, with a thickness corresponding to fourth thickness T4 (DETAIL-C). In other words, the first and second insulating materials 302 and 304, having a cumulated thickness equal to first thickness T1, coat side 118R of electrode 112G. Side 118R is further coated with conductive material 306, with a thickness equal to second thickness T2. Side 118R of transistor 900 is for example coated similarly to side 118L of transistor 700.

More precisely, in the shown example:

first insulating material 302, having a thickness T3, extends in contact with electrode 112G along side 118R;

second insulating material 304, having a thickness T4, extends in contact with first insulating material 302 along side 118R of electrode 112G; and conductive material 306, having a thickness T2, extends in contact with second insulating material 304 along side 118R of electrode 112G.

In this example, first insulating material 302 forms a continuous layer coating sides 118L, 118R and the bottom 118B of electrode 112G. However, second insulating material 304 and conductive material 306 each form two separate layer portions, located on either side of the bottom 118B of electrode 112G. More precisely, the conductive material located on side 118L is insulated from the conductive material 306 located on side 118R and the insulating material 304 located on side 118L is separate from the insulating material 304 located on side 118R.

In the shown example, conductive material 306, second insulating material 304, and first insulating material 302 extend horizontally above the upper surface 108T of layer 108. However, conductive material 306 and first and second insulating materials 302 and 304 do not extend, towards drain electrode 112D, beyond the area in line with gate electrode 112G. This enables to maintain a sufficient distance between the gate G and the drain D of transistor 300, in particular to avoid any risk of breakdown between the conductive material 306 located on side 118R and drain electrode 112D when transistor 300 is biased, for example, under a voltage equal to approximately 650 V.

An advantage of this embodiment lies in the fact that transistor 900 comprises an overthickness of insulating material on side 118R of gate electrode 112G, providing a higher insulation than the transistor 100 of FIG. 1. This overthickness is due to the presence of second insulating material 304 along side 118R of electrode 112G, bottom 118B comprising no second insulating material 304. Further, the bottom 118B of electrode 112G is separated from layer 104 only by the thickness T3 of first insulating material 302. This enables to decrease the stray capacitance Cgd of transistor 900 by from approximately 15 to 30% with respect to a transistor 900 having its side 118R comprising no insulating material 304 and by from approximately 40 to 45% with respect to transistor 100. The threshold voltage Vth of transistor 900 is relatively low, for example, in the order of 1 V, and mainly controlled by the bottom 118B of gate electrode 112G.

FIGS. 10 to 15 hereabove illustrate successive steps of an example of an implementation mode of the transistor 900 of FIG. 9.

Figure 10:
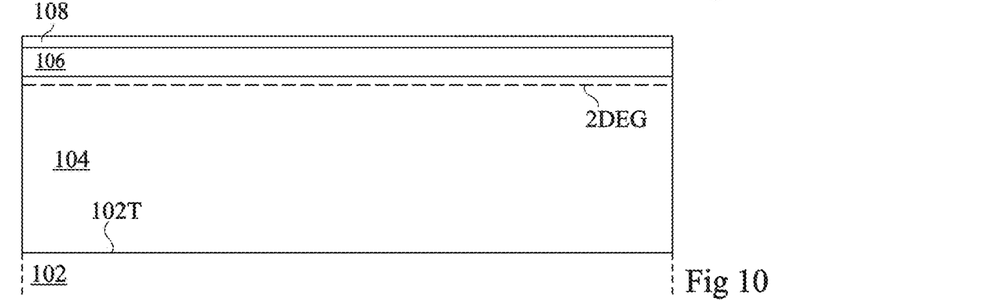
FIG. 10 is a partial simplified cross-section view illustrating a step of an implementation mode of a method of forming the transistor of FIG. 9.

FIG. 10 is a partial simplified cross-section view illustrating a step of the implementation mode of the embodiment of the transistor of FIG. 9.

During this step, layer 104, layer 106, and layer 108 are successively formed, in this order, on the side of surface 102T of substrate 102. More precisely:

layer 104 extends continuously and over the entire upper surface 102T of substrate 102;

layer 106 extends continuously and over the entire upper surface of layer 104; and layer 108 extends continuously and over the entire upper surface of layer 106.

Layers 104, 106, and 108 are for example formed by epitaxy. Although this is not shown in FIG. 10, an intermediate aluminum nitride layer may be interposed between layers 104 and 106. In this case, this enables to favor the epitaxy of aluminum-gallium nitride layer 106 on gallium nitride layer 104 by lattice constant matching.

In FIG. 10, the two-dimensional electron gas 2DEG extends laterally and continuously in layer 104, under the interface between layers 104 and 106.

Figure 11:
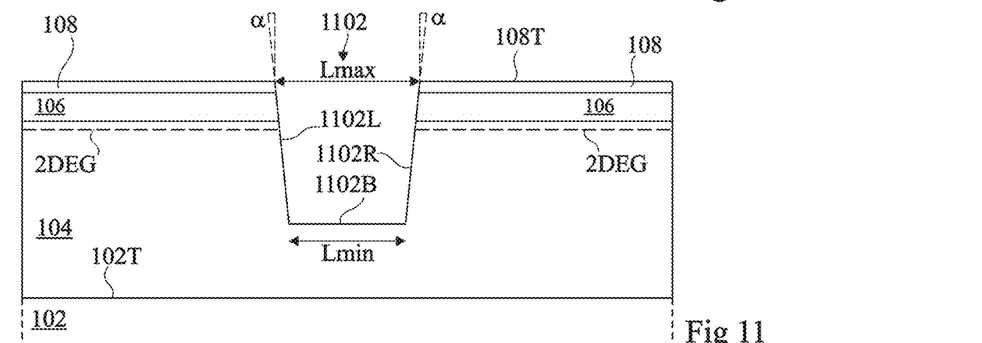
FIG. 11 is a partial simplified cross-section view illustrating another step of the implementation mode of the method of forming the transistor of FIG. 9.

FIG. 11 is a partial simplified cross-section view illustrating another step of the implementation mode of the method of forming the transistor 900 of FIG. 9.

During this step, a trench 1102 extending vertically towards substrate 102 from the upper surface 108T of layer 108 is formed (for example made of silicon nitride or of gallium nitride). More precisely, in the shown example, trench 1102 crosses layers 108 and 106 and partially penetrates into the thickness of layer 104. Trench 1102 stops in layer 104 and does not reach the upper surface 102T of substrate 102.

As an example, trench 1102 is formed by atomic layer etching (ALE).

According to an implementation mode, it is ascertained that trench 1102 has oblique lateral walls 1102L and 1102R, or sides. More precisely, trench 1102 is for example etched so that its lateral walls 1102L and 1102R each form an angle α relative to a normal to the upper surface 108T of layer 108. As an example, the angle α formed by walls 1102L and 1102R is in the range from 5° to 45°, for example, equal to approximately 10°.

Lateral walls 1102L and 1102R are inclined so that trench 1102 has a flared profile. More precisely, it is ascertained that trench 1102 has an opening (on top, in the orientation of FIG. 11) wider than its bottom 1102B (at the bottom, in the orientation of FIG. 11).

The lateral walls 1102L and 1102R of trench 1102 form sides of the future gate region 110G of transistor 900. More precisely:
wall 1102L forms the side of gate region 110G located on the side of source electrode 112S; and
wall 1102R, opposite to wall 1102L, forms the side of gate region 110G located on the side of drain electrode 112D.

The fact of providing a trench 1102 having oblique lateral walls 1102L and 1102R enables, when transistor 900 is in the on state, to ease the passage of the electrons around gate region 110G. This more precisely enables to ease the flowing down of electrons along the side of gate region 110G located on the side of electrode 112S, that is, parallel to wall 1102L of trench 1102.

The fact of providing oblique walls 1102L and 1102R further enables to decrease the length of conduction path 116B (FIG. 3) under the bottom of gate region 110G. The on-state resistance Ron of transistor 900 is thus decreased.

As an example, trench 1102 has:
a maximum width Lmax in the range from 0.4 to 1 μm, for example, equal to approximately 0.5 μm; and
a minimum width Lmin in the range from 0.2 to 0.4 μm, for example equal to approximately 0.3 μm.

At the end of this step, the two-dimensional electron gas 2DEG is discontinuous. More precisely, trench 1102 separates the two-dimensional electron gas 2DEG into two portions located on either side of trench 1102. Layers 106 and 108 are further each separated into two separate layer portions located on either side of trench 1102.

Figure 12:
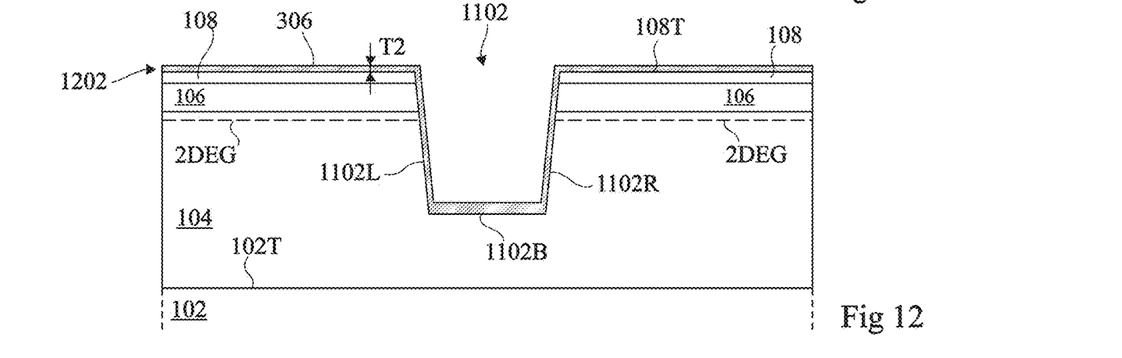
FIG. 12 is a partial simplified cross-section view illustrating still another step of the implementation mode of the method of forming the transistor of FIG. 9.

FIG. 12 is another partial simplified cross-section view illustrating still another step of the implementation mode of the method of forming the transistor 900 of FIG. 9.

During this step, the thickness T2 of conductive material 306 is deposited over the structure on the side of surface 102T of substrate 102. In the shown example, conductive material 306 forms a continuous conductive layer 1202 coating the upper surface 108T of layer 108 as well as the lateral walls 1102L, 1102R and the bottom 1102B of trench 1102.

As an example, conductive layer 1202 is formed by a conformal deposition technique, for example, by chemical vapor deposition (CVD). The presence of crystal defects is thus avoided or limited at the interface between layers 104 and 1202, these defects being likely to form trap states for electrons.

Figure 13:
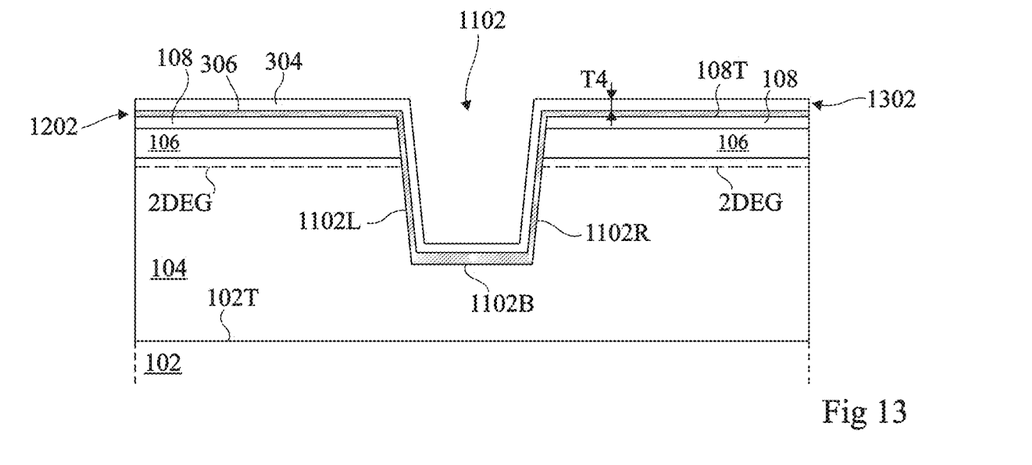
FIG. 13 is a partial simplified cross-section view illustrating still another step of the implementation mode of the method of forming the transistor of FIG. 9.

FIG. 13 is another partial simplified cross-section view illustrating still another step of the implementation mode of the method of forming the transistor 900 of FIG. 9.

During this step, the thickness T4 of second insulating material 304 is deposited on the structure on the side of surface 102T of substrate 102. In the shown example, material 304 forms a first continuous insulating layer 1302. Insulating layer 1302 coats conductive layer 1202.

Insulating layer 1302 is for example made of alumina or of silica. In the case where layer 1302 is made of alumina, an aluminum nitride (AlN) layer may be deposited over the structure, on the side of the upper surface 102T of substrate 102, prior to the forming of layer 1302. This for example allows a better lattice constant matching between layers. The number of defects likely to be present at the interface is thus decreased.

Figure 14:
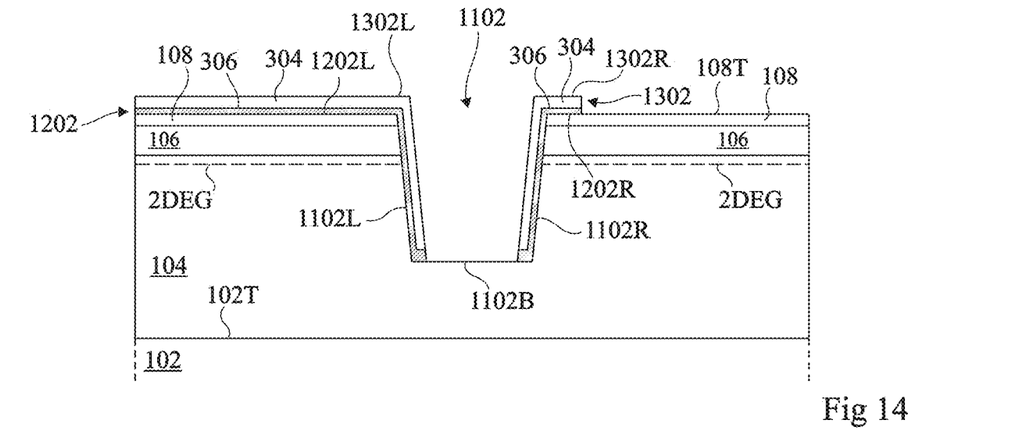
FIG. 14 is a partial simplified cross-section view illustrating still another step of the implementation mode of the method of forming the transistor of FIG. 9.

FIG. 14 is a partial simplified cross-section view illustrating still another step of the implementation mode of the method of forming the transistor 900 of FIG. 9.

During this step, conductive layer 1202 and insulating layer 1302 are etched to expose the bottom 1102B of trench 1102. Portions of layers 1202 and 1302 coating the bottom 1102B of trench 1102 are removed for this purpose. Layers 1202 and 1302 are thus each separated into two separate portions.

One more precisely obtains, at the end of the etching:
a portion 1202L of conductive layer 1202, located on the side of wall 1102L of trench 1102;
another portion 1202R of conductive layer 1202, located on the side of wall 1102R of trench 1102 and insulated from portion 1202L;
a portion 1302L of insulating layer 1302, located on the side of wall 1102L of trench 1102; and
another portion 1302R of insulating layer 1302, located on the side of wall 1102R of trench 1102 and separate from portion 1302L.

In the shown example, layers 1202 and 1302 are further etched on the side of future electrode 112D (FIG. 9), that is, on the right-hand side in the orientation of FIG. 14, to expose a portion of the upper surface 108T of layer 108 located between future electrode 112G and future electrode 112D.

As an example, the portions 1202L and 1202R of conductive layer 1202 and the portions 1302L and 1302R of the insulating layer are formed by a wet etching method. This enables, in particular, to obtain a low roughness at the level of the bottom 1102B of trench 1102. The on-state resistance Ron of transistor 900 is thus decreased.

The wet etching may be preceded by a dry etching step, for example, plasma-enhanced. In this case, the wet etching enables to improve the surface state, obtained at the end of the dry etching step, of the bottom 1102B of trench 1102.

As a variant, layers 1202 and 1302 may be etched so that portions 1202L, 1202R, 1302L, and 1302R extend over a portion of the bottom 1102B of trench 1102. In this case, the portions 1202L and 1202R of layer 1202 each partially coat the bottom 1102B of trench 1102 and the portions 1302L and 1302R of layer 1302 for example extend on top of and in contact with portions 1202L and 1202R, respectively.

It is however ascertained that the portions 1202L and 1202R of conductive layer 1202 are separate. As an example, layers 1202 and 1302 are etched so that portions 1202L, 1302L are separated from portions 1202R, 1302R by a distance sufficient to avoid any breakdown risk due to the biasing of the drain electrode 112D (FIG. 9) of transistor 900. This distance is for example in the range from 100 to 300 nm.

The fact of continuing the portions 1202L and 1202R of layer 1202 on the bottom 1102B of trench 1102 enables to avoid or to limit the occurrence of edge effects tending to increase the on-state resistance Ron of transistor 900.

Figure 15:
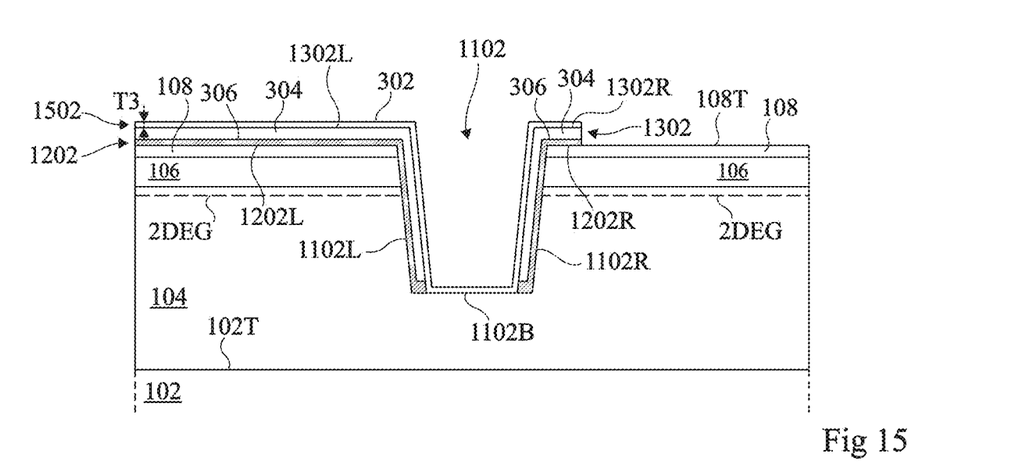
FIG. 15 is a partial simplified cross-section view illustrating still another step of the implementation mode of the method of forming the transistor of FIG. 9.

FIG. 15 is a partial simplified cross-section view illustrating still another step of the implementation mode of the method of forming the transistor 900 of FIG. 9.

During this step, the thickness T3 of first insulating material 302 is deposited on the structure on the side of surface 102T of substrate 102. Material 302 is then etched to only keep a single insulating layer 1502 coating the portions 1302L and 1302R of first insulating layer 1302 and the bottom 102B of trench 1102. During the etching operation, the material 302 coating the portion of the upper surface 108T of layer 108 located between future electrode 112G and future electrode 112D is more precisely removed.

One thus advantageously obtains, along each wall 1102L, 1102R of trench 1102, an overthickness of insulating material with respect to the bottom 1102B of trench 1102.

Based on the structure described in relation with FIG. 15, electrodes 112S, 112G, and 112D are then formed to obtain the transistor 900 discussed in relation with FIG. 9. As an example, electrodes 112S, 112G, and 112D are obtained by deposition and then local etching of a metal layer (not shown) coating the upper surface of insulating layer 1502 and the exposed portion of the upper surface 108T of layer 108. The gate electrode 112G of transistor 900 (FIG. 9) is more precisely formed inside of trench 1102, the sides 118L and 118R of electrode 112G thus being substantially parallel to the walls 1102L and 1102R of trench 1102.

Various embodiments and variants have been described. Those skilled in the art will understand that certain features of these various embodiments, implementation modes, and variants, may be combined and other variants will occur to those skilled in the art.

Based on the above indications, it will in particular be within the abilities of those skilled in the art to provide:
a transistor similar to transistor 900 but with no connection between source electrode 112S and conductive material 306 on side 118L of gate electrode 112G; and
another transistor similar to transistor 900 or to transistor 700 but where side 118R of gate electrode 112G is coated with first insulating material 302 and does not comprise second insulating material 304 and/or conductive material 306, like side 118R of transistor 300. This other transistor may further comprise a back barrier layer similar to the layer 308 discussed in relation with FIG. 3.

It will further be within the abilities of those skilled in the art to provide at least one shoulder on side 118L and/or on side 118R of the gate electrode 112G of transistors 300, 500, 700, and 900, for example, a shoulder on each side 118L, 118R. As an example, this shoulder is approximately located at the level of aluminum-gallium nitride layer 106. This then enables to smooth an electric field originating from a biasing of drain electrode 112 with respect to gate electrode 112G. In other words, the shoulder plays in this case a role similar to that of a field plate. As a variant, the shoulder is located within the thickness of gallium nitride layer 104, to ease the flowing of electrons around gate region 110G, which enables to still further decrease the on-state resistance Ron of the transistor.

The adaptation of the method of forming transistor 900 described in relation with FIGS. 10 to 15 to obtain the transistors 300, 500, and 700 of FIGS. 3, 5, and 7 as well as the transistors of the other embodiments and variants of the above paragraphs, is also within the abilities of those skilled in the art.

Finally, the practical implementation of the described embodiments, implementation modes, and variants is within the abilities of those skilled in the art based on the functional indications given hereabove. In particular, it will be within the abilities of those skilled in the art to select materials 302, 304, and 306 and to adapt thicknesses T1, T2, T3, and T4 according to the targeted application.

The invention claimed is:

1. Transistor comprising a gallium nitride layer having a first gate electrode penetrating into it, having:
a first side coated:
with a first thickness of a first electrically insulating material and of a second electrically insulating material; and
with a second thickness of an electrically conductive material; and
a bottom coated with a third thickness, smaller than the first thickness, of the first electrically insulating material.

2. Transistor according to claim 1, further comprising second and third electrodes, located on either side of the first electrode and partially penetrating into the gallium nitride layer, the second electrode being closer to the first electrode than the third electrode and the first side being located on the side of the second electrode.

3. Transistor according to claim 2, wherein the electrically conductive material coating the first side extends all the way to the second electrode.

4. Transistor according to claim 1, wherein the bottom of the first electrode is separated from the gallium nitride layer only by the third thickness of the first electrically insulating material.

5. Transistor according to claim 1, wherein a second side of the first electrode, opposite to the first side, is coated with the first electrically insulating material, with a thickness equal to the third thickness.

6. Transistor according to claim 5, wherein the second side is further coated with the electrically conductive material, with a thickness equal to the second thickness.

7. Transistor according to claim 6, wherein the electrically conductive material coating the second side is insulated from the electrically conductive material coating the first side.

8. Transistor according to claim 1, wherein a second side of the first electrode, opposite to the first side, is coated with the first electrically insulating material and with the second electrically insulating material, with a thickness equal to the first thickness.

9. Transistor according to claim 1, wherein the second electrically insulating material is identical to the first electrically insulating material.

10. Transistor according to claim 1, wherein the second electrically insulating material is different from the first electrically insulating material.

11. Method of manufacturing a transistor according to claim 1, comprising the steps of:
   a) forming a trench inside of a gallium nitride layer;
   b) coating a first side of the trench with an electrically conductive layer and then with a first electrically insulating layer;
   c) coating a bottom of the trench with a second electrically insulating layer, thinner than the first electrically insulating layer; and
   d) forming a first gate electrode of the transistor inside of the trench.

12. Method according to claim 11, wherein, at step c), the first electrically insulating layer is coated with the second electrically insulating layer.

13. Method according to claim 11, wherein, at step c), a second side of the trench, opposite to the first side, is coated with the second electrically insulating layer.

14. Method according to claim 13, wherein, at step b), the second side of the trench is coated with the electrically conductive layer.

15. Method according to claim 14, wherein, at step b), the second side of the trench is then coated with the first electrically insulating layer.

16. Method according to claim 11, further comprising, between steps b) and c), the step of removing portions of the first electrically insulating layer and of the electrically conductive layer located at the bottom of the trench.

* * * * *